United States Patent [19]
Tabata et al.

[11] Patent Number: 5,889,663
[45] Date of Patent: Mar. 30, 1999

[54] CIRCUIT FOR BALANCING STEADY-STATE CURRENTS OF SWITCHING DEVICES IN ELECTRIC POWER CONVERTER

[75] Inventors: Masafumi Tabata; Seiki Igarashi, both of Tokyo, Japan

[73] Assignee: Fuji Electric Co., Ltd., Kawasaki, Japan

[21] Appl. No.: 75,235

[22] Filed: May 11, 1998

[30] Foreign Application Priority Data

May 14, 1997 [JP] Japan .................................... 9-124097

[51] Int. Cl.$^6$ .................................................... H02H 7/122
[52] U.S. Cl. ................................................. 363/56; 363/71
[58] Field of Search .................... 363/50, 55, 56, 363/65, 71, 95, 97, 131

[56] References Cited

U.S. PATENT DOCUMENTS

| | | | |
|---|---|---|---|
| 3,633,070 | 1/1972 | Vassos | 317/27 |
| 4,104,687 | 8/1978 | Zulaski | 361/17 |
| 4,352,210 | 9/1982 | Puckette | 455/317 |
| 5,172,310 | 12/1992 | Deam et al. | 363/144 |

*Primary Examiner*—Matthew Nguyen
*Attorney, Agent, or Firm*—Kanesaka & Takeuchi

[57] ABSTRACT

A balancing circuit balances the steady-state currents of the switching devices in an electric power converter, which facilitates reducing the size of the power converter and precisely balancing the steady-state currents. The balancing circuit holds transient sensing voltages at the time of turning-on of the switching devices, and detects the unbalance between the currents of the switching devices based on the distribution or unbalance of the sensing voltages by comparing the steady-state sensing voltages or the values corresponding to the steady-state sensing voltages with the stored transient sensing voltages. The steady-state currents of the switching devices are balanced by regulating the drive voltages of the switching devices based on the detected distribution of the steady-state currents.

6 Claims, 8 Drawing Sheets

CIRCUIT FOR BALANCING STEADY-STATE CURRENTS OF SWITCHING DEVICES IN ELECTRIC POWER CONVERTER

BACKGROUND OF THE INVENTION AND RELATED ART STATEMENT

The present invention relates to a balancing circuit for detecting unbalance between steady-state currents of semiconductor switches connected parallel to one another in an electric power converter and for balancing the steady-state currents.

FIG. 5 is a block diagram of a conventional chopper circuit including semiconductor switches, which are represented by insulated gate bipolar transistors (IGBTs), and shunt resistors for detecting the currents of the IGBTs.

Referring now to FIG. 5, a switching circuit $1_1$ includes an IGBT $1_{a1}$, a diode $1_{b1}$ connected in opposite parallel to the IGBT $1_{a1}$, and a gate drive circuit $1_{c1}$ connected between the gate and emitter of the IGBT $1_{a1}$ for turning on and off the IGBT $1_{a1}$. The other switching circuits are constructed in the same manner as in the switching circuit $1_1$. The switching circuits $1_1$ through $1_n$ are connected parallel to one another to constitute a first parallel circuit. The emitters of the IGBTs $1_{a1}$ through $1_{an}$ are connected collectively through respective shunt resistors $1_{e1}$ through $1_{en}$. Another parallel circuit (hereinafter referred to as a "second parallel circuit") includes switching circuits $2_1$ through $2_n$ and shunt resistors $2_{e1}$ through $2_{en}$. The first and second parallel circuits thus constructed are connected in series to each other.

A DC link capacitor 5 is connected to both ends of the series circuit including the first and second parallel circuits. An inductive load 4 is connected to both ends of the second parallel circuit including the switching circuits $2_1$ through $2_n$ and shunt resistors $2_{e1}$ through $2_{en}$. The terminal voltages $V_{rs1}$ through $V_{rsn}$ of the shunt resistors $1_{e1}$ through $1_{en}$ are inputted to a balancing circuit 15. The balancing circuit 15 feeds power supply voltages $V_{cc1}$ through $V_{ccn}$ to the gate drive circuits $1_{c1}$ through $1_{cn}$ of the switching circuits $1_1$ through $1_n$.

The chopper circuit of FIG. 5 regulates the electric power fed to the inductive load 4 by repeating simultaneously switching-on or switching-off of the IGBTs $1_{a1}$ through $1_{an}$ by means of a pulse distributor circuit 3. FIG. 8 is a set of operational wave forms of the chopper circuit of FIG. 5. Referring now to FIG. 8, $V_{CE}$ indicates the voltage between the collector and emitter of the IGBT, $I_{con}$ indicates the turn-on collector current of the IGBT, $I_{c1}$ through $I_{cn}$ indicate the collector currents of the respective IGBTs $1_{a1}$ through $1_{an}$, and $I_o$ indicates a load current.

A plurality of switching circuits (IGBTs) are connected parallel to obtain a current capability more than the rated current of one single switching circuit.

The chopper circuit of FIG. 5 operates as follows. The load current $I_o$ flows through the inductive load 4 when the IGBTs $1_{a1}$ through $1_{an}$ are turned on. When the IGBTs $1_{a1}$ through $1_{an}$ are simultaneously turned off from the above described state, the current $I_o$ that has been flowing through the inductive load 4 circulates through the diodes $2_{b1}$ through $2_{bn}$. Thus, by repeating the turning-on and turning-off of the main switches, i.e. IGBTs $1_{a1}$ through $1_{an}$, the electric power to be fed to the load is regulated. The second parallel circuit including the switching circuits $2_1$ through $2_n$ and shunt resistors $2_{e1}$ through $2_{en}$ is provided to circulate energy stored in the inductive load 4 while the IGBTs $1_{a1}$ through $1_{an}$ are in their on-state.

The conventional chopper circuit including a plurality of semiconductor switches connected parallel to one another causes the following problems. The currents flowing through the IGBTs $1_{a1}$ through $1_{an}$ are expressed by the following formula (1) when all the currents are balancing to one another.

$$I_{ci} = (1/n) \sum_{i=1}^{n} I_{ci} \ (i = 1, 2, \ldots, n) \tag{1}$$

FIG. 7 is a pair of curves relating to the collector current and the saturation voltage between the collector and emitter of the IGBT. Unbalance is caused between the currents $1_{c1}$ through $1_{cn}$ flowing through the IGBTs $1_{a1}$ through $1_{an}$ as described in FIG. 8 due to the distribution or unbalance of each saturation voltage between the collector and emitter of each IGBT shown in FIG. 7 and the distribution or unbalance of the circuit constants caused by wiring. The unbalance between the currents of the IGBTs causes unbalance between the steady-state losses and, in the worst case, it causes breakdown of the switching devices.

To obviate the above described problems, the current flowing through each switching device is detected, and the voltage between the gate and emitter of each switching device is boosted or lowered depending on the values of the detected current, so that the characteristics between $V_{CE}$ and $I_c$ may be identical to one another.

FIG. 7 shows an example in which the voltage between the gate and emitter of the IGBT $1_{a2}$ is changed from $V_{GE1}$ to $V_{GE2}$ so that the characteristics of the IGBT $1_{a2}$ may be identical to those of the IGBT $1_{a1}$.

In FIG. 5, the shunt resistors $1_{e1}$ through $1_{en}$ are disposed to detect the currents $1_{c1}$ through $1_{cn}$ flowing through the IGBTs $1_{a1}$ through $1_{an}$. The current flowing through each switching device is detected from the following formula (2), which relates to the voltage across the switching device and the current flowing through each switching device. In the formula (2), R represents the resistance in the shunt resistors $1_{e1}$ through $1_{en}$.

$$V_{rsi} = R \times I_{ci} \ (i=1, 2 \ldots n) \tag{2}$$

However, as the rated value of the switching device increases, the shunt resistor with a larger power capacity should be employed. The shunt resistor with a larger electric capacity causes larger size of the power converter.

FIG. 6 is a block diagram illustrating another conventional technique for detecting the currents flowing through the switching devices. Referring now to FIG. 6, a sensing resistor $1_{e1}$ is connected between a sensing terminal and an emitter terminal of an IGBT $1_{a1}$ to detect the terminal voltage $V_s$. In FIG. 6, $1_1'$ and $2_1'$ designate switching circuits.

The circuit of FIG. 6 detects the currents flowing through the switching devices as follows. When a current $I_{c1}$ flows in association with the turning-on of the IGBT $1_{a1}$, a current $I_s$ (hereinafter referred to as a "sensing current") as high as one several ten thousandth of the current $I_{c1}$ flows. As the sensing current $I_s$ flows, a sensing voltage $V_s$ is generated across the sensing resistor $1_{e1}$. The sensing voltage $V_s$ increases with an increase of the collector current $I_{c1}$. The sensing voltage $V_s$, the sensing current $I_s$ and the resistance $R_s$ of the sensing resistor $1_{e1}$ are related by the following formula (3).

$$V_s = R_s \times I_s \tag{3}$$

In the conventional technique described in FIG. 6, the sensing current $I_s$ flowing through the sensing resistor $1_{e1}$ is from several to several tens mA. Therefore, the sensing technique that employs a sensing resistor facilitates to minimize the power converter more than the sensing technique that employs a shunt resistor.

However, the sensing voltage $V_s$ across the sensing resistor causes a large distribution or unbalancing as compared with the sensing voltage obtained by the shunt resistance. Therefore, in the power converter like the chopper circuit of FIG. 5 which includes a plurality of switching circuits connected parallel to one another, sufficiently precise balance control is not attained in balancing the currents by detecting the currents flowing through the respective switching devices with the sensing resistors.

In view of the foregoing, it is an object of the invention to provide a balancing circuit for balancing the steady-state currents of the switching devices in an electric power converter, wherein the size of the power converter are minimized, and the steady-state currents are precisely balanced.

SUMMARY OF THE INVENTION

According to an aspect of the invention, there is provided a balancing circuit for balancing steady-state currents of switching devices in an electric power converter which includes a plurality of switching circuits connected parallel to one another. Each switching circuit includes one switching device and a sensing resistor connected to the switching device. The balancing circuit includes a plurality of sample hold means which hold the transient sensing voltages detected by the sensing resistors at the time of turning-on of the switching devices; a plurality of amplifying means which amplify the sensing voltages in the steady state with gains depending on the transient sensing voltages held in the sample hold means; average value calculating means which calculates the average of the outputs of the amplifying means; a plurality of comparing means which compare the output of the calculating means and the outputs of the amplifying means; and a plurality of regulating means, each regulating the drive voltage of the switching device so that the inputs to the comparing means may be equalized with one another.

According to another aspect of the invention, there is provided a balancing circuit for balancing steady-state currents of the switching devices in an electric power converter which includes a plurality of switching circuits connected parallel to one another. Each switching circuit includes one switching device and a sensing resistor connected to the switching devices. The balancing circuit includes a plurality of sample hold means which hold the transient sensing voltages detected with the sensing resistors at the time of turning-on of the switching devices; a plurality of multiplying means, each multiplying the steady-state sensing voltage of one switching device and the transient sensing voltages of the other switching devices, the transient sensing voltages being held in the sample hold means; average value calculating means which calculates an average of the outputs of the multiplying means; a plurality of comparing means which compare the output of the calculating means and the outputs of the multiplying means; and a plurality of regulating means, each regulating the drive voltage of one switching device so that the inputs to the comparing means may be equalized with one another.

According to still another aspect of the invention, there is provided a balancing circuit for balancing steady-state currents of the switching devices in an electric power converter which includes a plurality of switching circuits connected parallel to one another, each including one switching device.

The balancing circuit includes a plurality of integrating means, each integrating induced voltage across an inductance of each switching device with a current changing rate of the switching device; average value calculating means which calculates the average of the outputs of the integrating means; a plurality of comparing means which compare the output of the calculating means and the outputs of the integrating means; and a plurality of regulating means, each regulating the drive voltage of one switching device so that the inputs to the comparing means may be equalized with one another.

DETAILED DESCRIPTION OF PREFERRED EMBODIMENTS

Now the present invention will be described hereinafter with reference to the accompanied drawings which illustrate the preferred embodiments of the invention.

Figure 1:
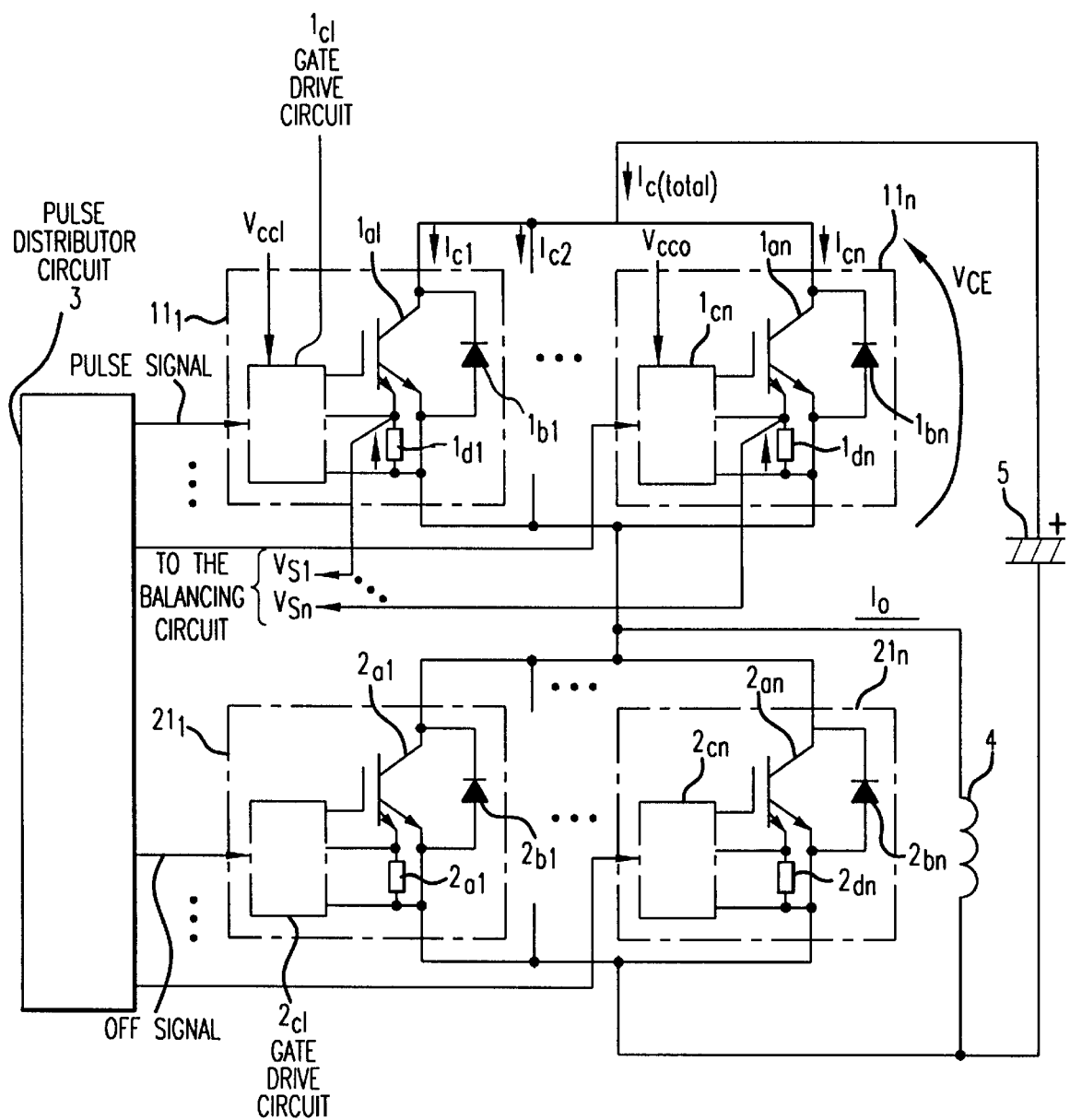
FIG. 1 is a block diagram of a chopper circuit to which the invention is applied.

FIG. 1 is a block diagram of an embodiment of a chopper circuit to which the present invention is applied. Referring now to FIG. 1, a switching circuit $11_1$ includes an IGBT $1_{a1}$, a diode $1_{b1}$ connected in opposite parallel to the IGBT $1_{a1}$, a gate drive circuit $1_{c1}$ connected between the gate and emitter of the IGBT $1_{a1}$ for turning on and off of the IGBT $1_{a1}$, and a sensing resistor $1_{d1}$ connected between the sensing terminal and emitter of the IGBT $1_{a1}$ so that a sensing voltage $V_{s1}$ is detected.

The other switching circuits are constructed in the same manner as in the switching circuit $11_1$. The switching circuits $11_1$ through $11_n$ are connected parallel to one another to constitute a first parallel circuit. The sensing voltages $V_{s1}$ through $V_{sn}$ are fed to a balancing circuit described later.

Figure 5:
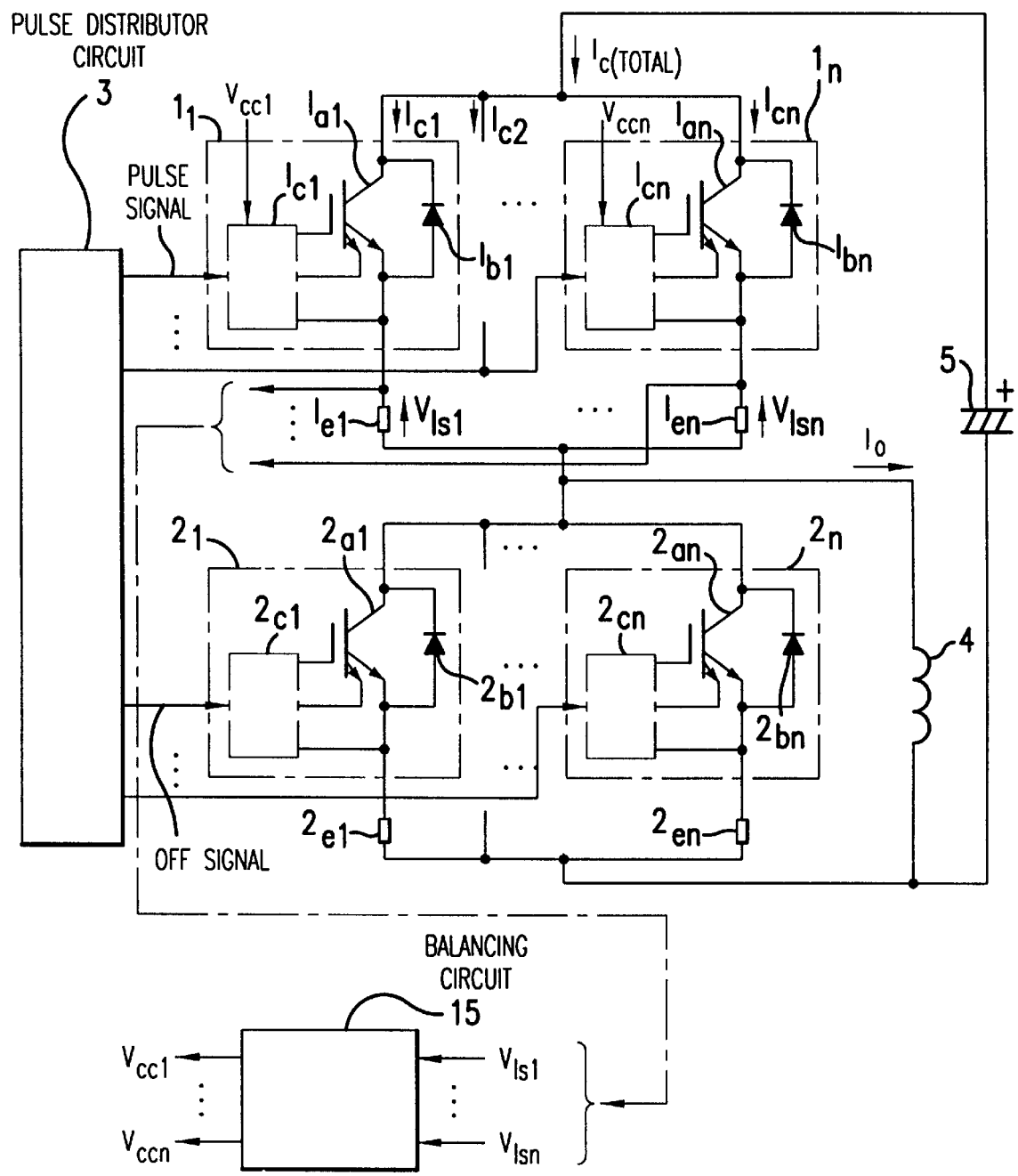
FIG. 5 is a block diagram of a conventional chopper circuit including semiconductor switches, e.g. IGBTS, and shunt resistors for detecting the currents of the IGBTS.
Figure 6:
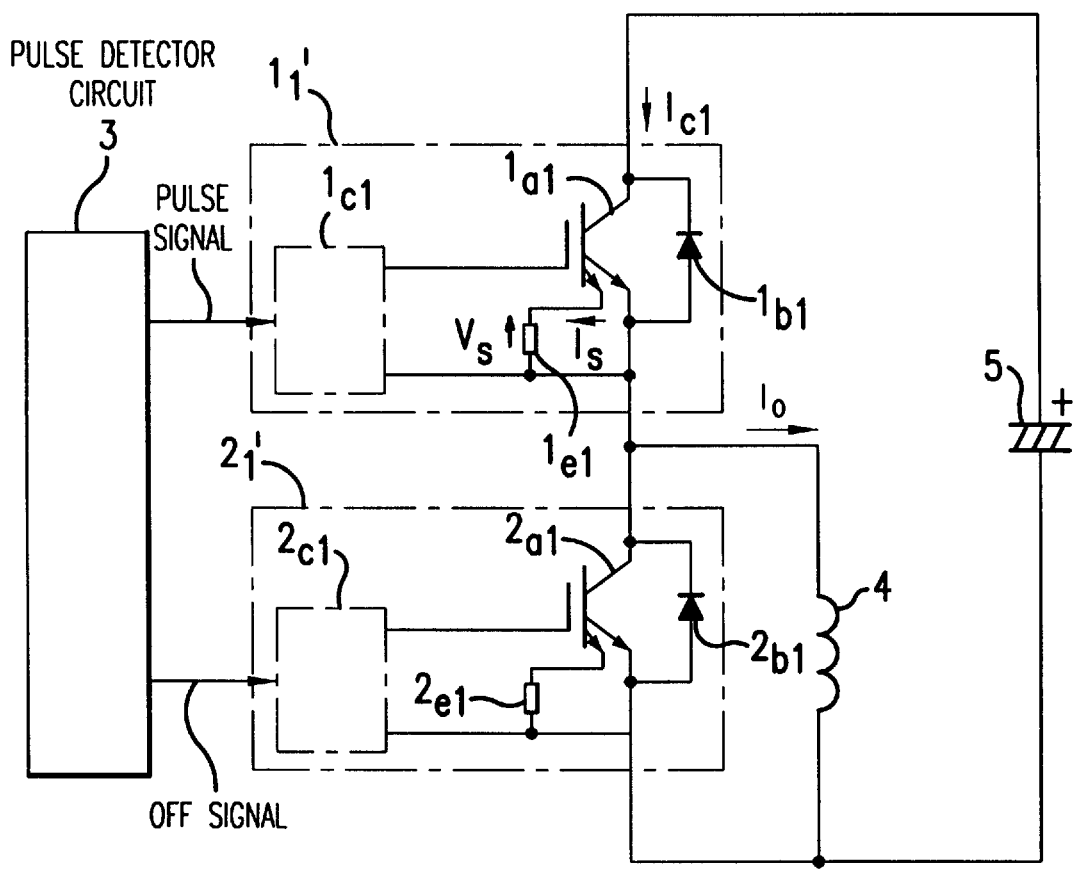
FIG. 6 is a block diagram illustrating another conventional technique for detecting the currents flowing through the switching devices.

A second parallel circuit includes switching circuits $21_1$ through $21_n$. The first and second parallel circuits are connected in series to each other. A pulse distributor circuit 3, an inductive load 4 and a DC link capacitor 5 are connected in the same manner as in FIG. 5. The chopper circuit of FIG. 1 regulates the electric power fed to the inductive load 4 by repeating simultaneously switching-on or switch-off of the IGBTs $1_{a1}$ through $1_{an}$ by means of the pulse distributor circuit 3 in the same manner as in the conventional chopper circuit.

Figure 2:
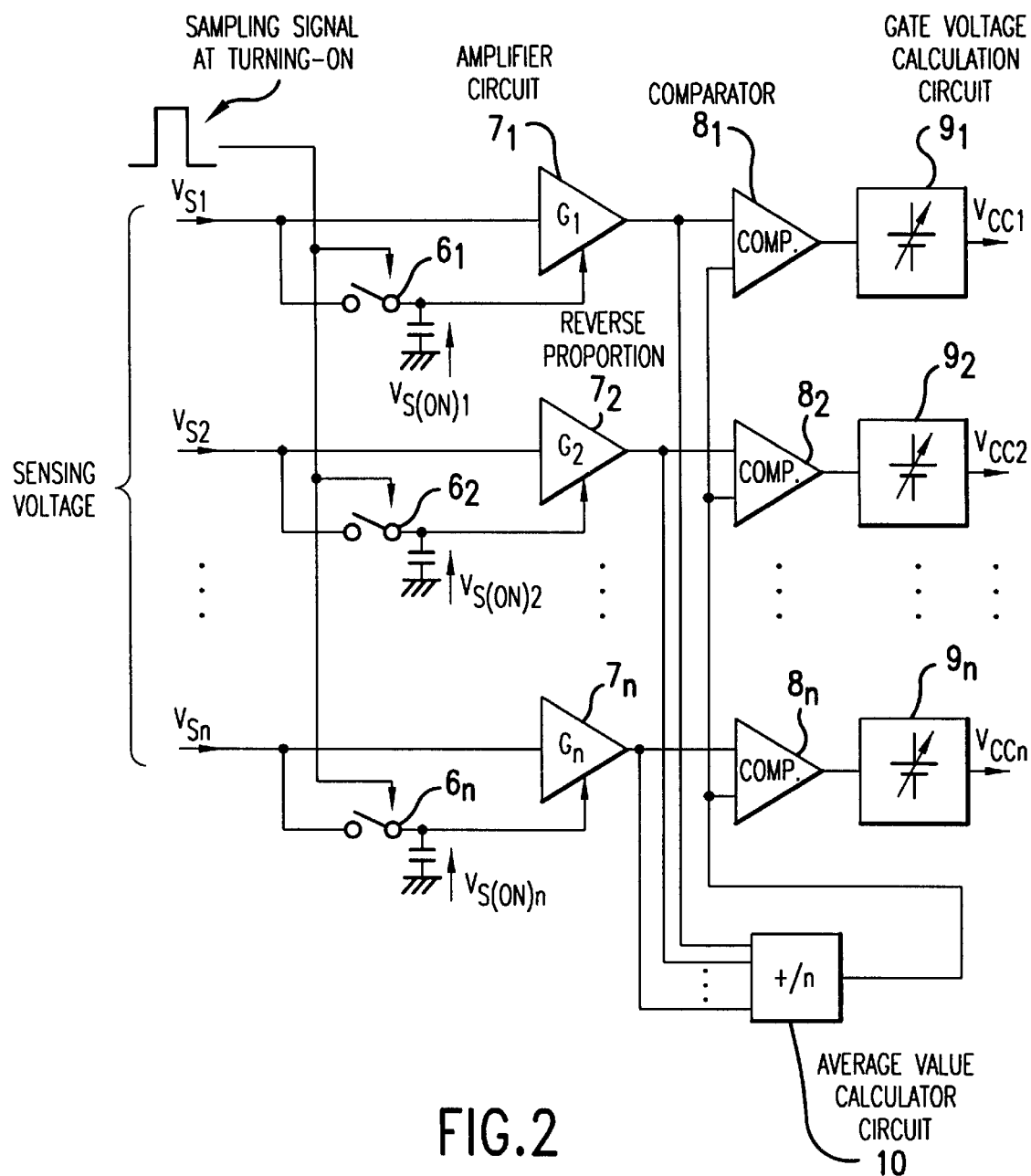
FIG. 2 is a block diagram of a first embodiment of a balancing circuit according to the present invention.

FIG. 2 is a block diagram of a first embodiment of a balancing circuit according to the present invention. Referring now to FIG. 2, sensing voltages $V_{s1}$ through $V_{sn}$ are inputted to sample hold circuits $6_1$ through $6_n$ and amplifier circuits $7_1$ through $7_n$. The outputs of the sample hold circuits $6_1$ through $6_n$ are inputted to the amplifier circuits $7_1$ through $7_n$. The outputs of the amplifier circuits $7_1$ through $7_n$ are inputted to an average value calculator circuit 10. The output of the average value calculator circuit 10 and the outputs of the amplifier circuits $7_1$ through $7_n$ are inputted to comparators $8_1$ through $8_n$. The outputs of the comparators $8_1$ through $8_n$ are inputted to gate voltage regulator circuits $9_1$ through $9_n$. The regulator circuits $9_1$ through $9_n$ output power supply voltages $V_{cc1}$ through $V_{ccn}$ to the gate drive circuits $1_{c1}$ through $1_{cn}$ of the switching circuits $11_1$ through $11_n$ shown FIG. 1.

In FIG. 2, $V_{s(on)1}$ through $V_{s(on)n}$, which are the sensing voltages $V_{s1}$ through $V_{sn}$ across the sensing resistors $1_{d1}$ through $1_{dn}$ when the IGBTs $1_{a1}$ through $1_{an}$ are turned on, are inputted to the sample hold circuits $6_1$ through $6_n$ in response to a sampling signal and stored in the sample hold circuits $6_1$ through $6_n$.

Figure 8:
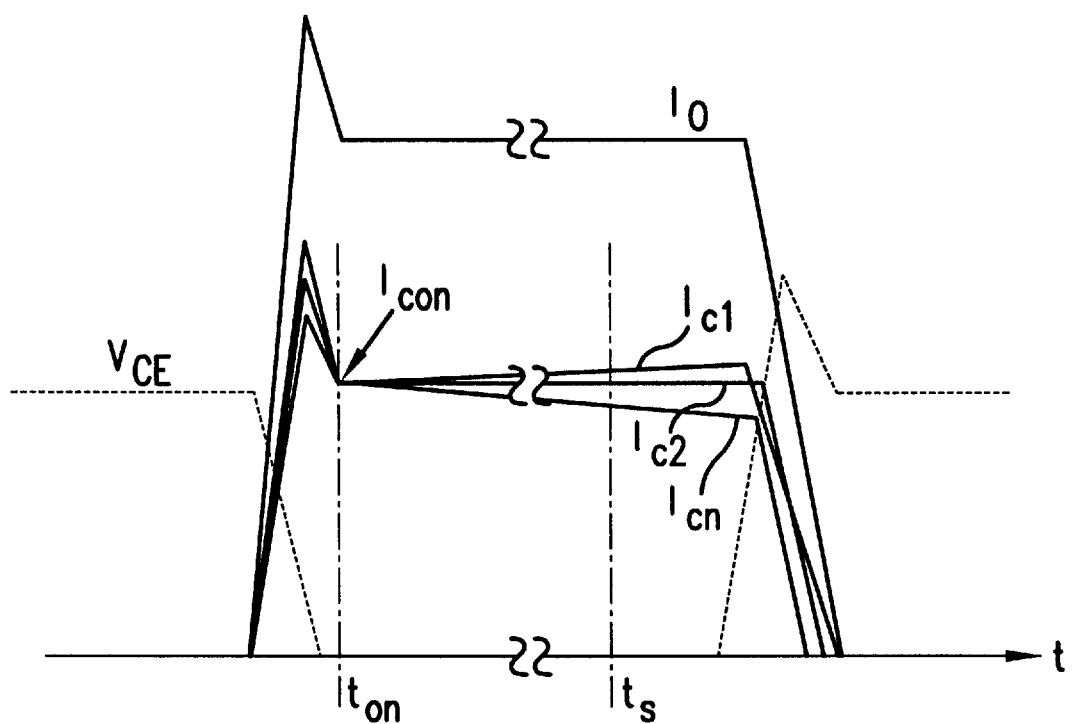
FIG. 8 is a set of operational wave forms of the chopper circuit of FIG. 5.

Since the IGBTs do not exhibit tradeoff characteristics in the turning-on, that is $t=t_{on}$ in FIG. 8, the collector currents of the IGBTs $1_{a1}$ through $1_{an}$ are balancing with one another at the turning-on of the IGBTs. The deviations of the sensing voltages are corrected by adjusting the gains of the amplifier circuits $7_1$ through $7_n$ with the voltages $V_{s(on)1}$ through $V_{s(on)n}$ stored in the sample hold circuits $6_1$ through $6_n$. Preferably, inversely proportional amplifier circuits, gains of which rise when the detected voltages are distributing and small, are employed for the amplifier circuits $7_1$ through $7_n$. Thus, all the inversely proportional amplifier circuits $7_1$ through $7_n$ output certain values when the collector currents are balancing to one another.

Then, the sensing voltages $V_{s1}$ through $V_{sn}$ in the steady state are inputted to the amplifier circuits $7_1$ through $7_n$, the gains of which have been adjusted as described above. The outputs of the amplifier circuits $7_1$ through $7_n$ are inputted to the average value calculator circuit 10. The outputs of the amplifier circuits $7_1$ through $7_n$ are compared with the output of the average value calculator circuit 10 in the comparators $8_1$ through $8_n$.

Unbalance between the currents flowing through the IGBTs (collector currents) is detected based on the output from any one of the comparators $8_1$ through $8_n$, that is whether the above described two inputs in any one of the comparators $8_1$ through $8_n$ are identical or not.

Figure 7:
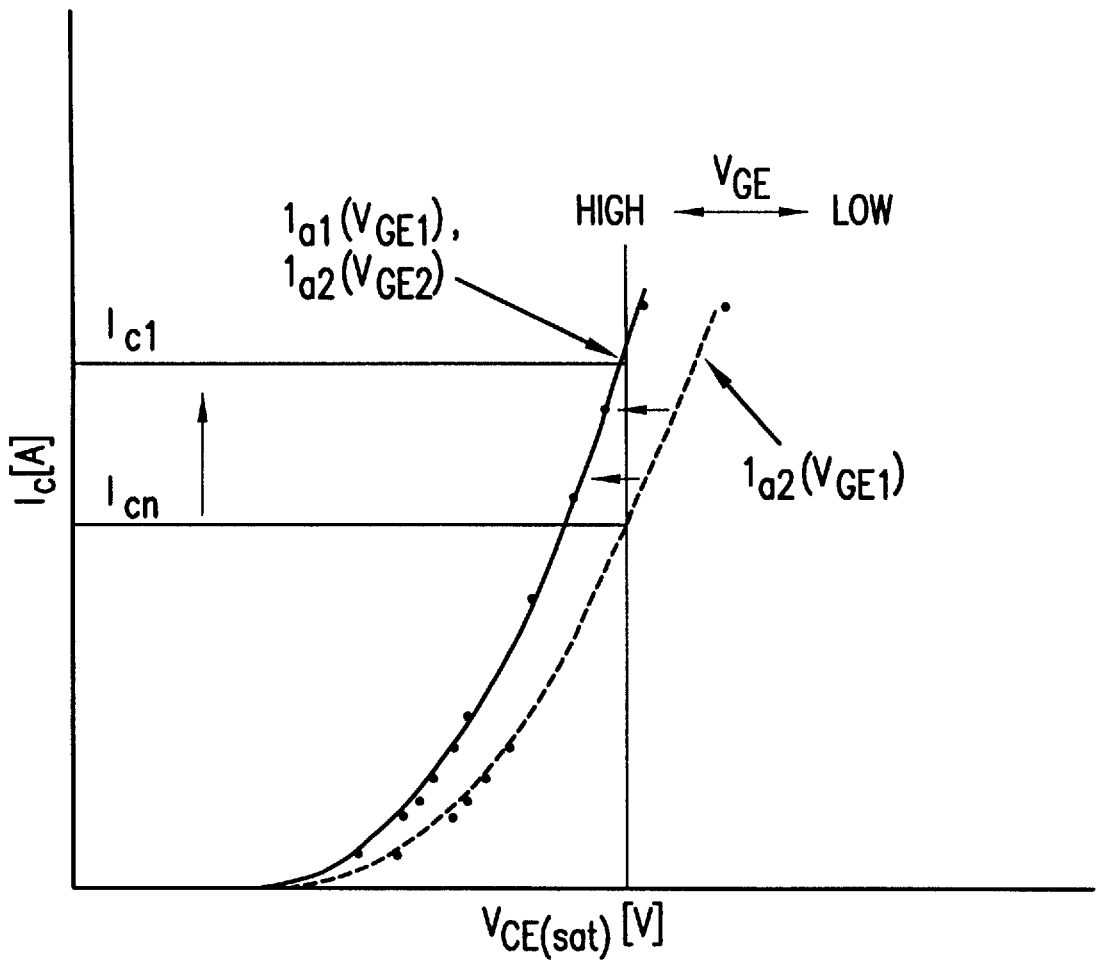
FIG. 7 is a pair of curves relating to the collector current and the saturation voltage between the collector and emitter of the IGBTs.

The outputs from the comparators $8_1$ through $8_n$ are inputted to the gate voltage regulator circuits $9_1$ through $9_n$. The regulator circuits $9_1$ through $9_n$ output power supply voltages $V_{cc1}$ through $V_{ccn}$ for regulating the gate voltages of the IGBTs so that the outputs from the comparators $8_1$ through $8_n$ converge to zero. For the small collector current, by increasing or boosting the gate voltage of the IGBT, the saturation voltage $V_{CE(sat)}$ between the gate and emitter of the IGBT is lowered as described in FIG. 7, and therefore, the collector current is increased. Thus, the steady-state currents of the switching devices are balanced to one another.

Figure 3:
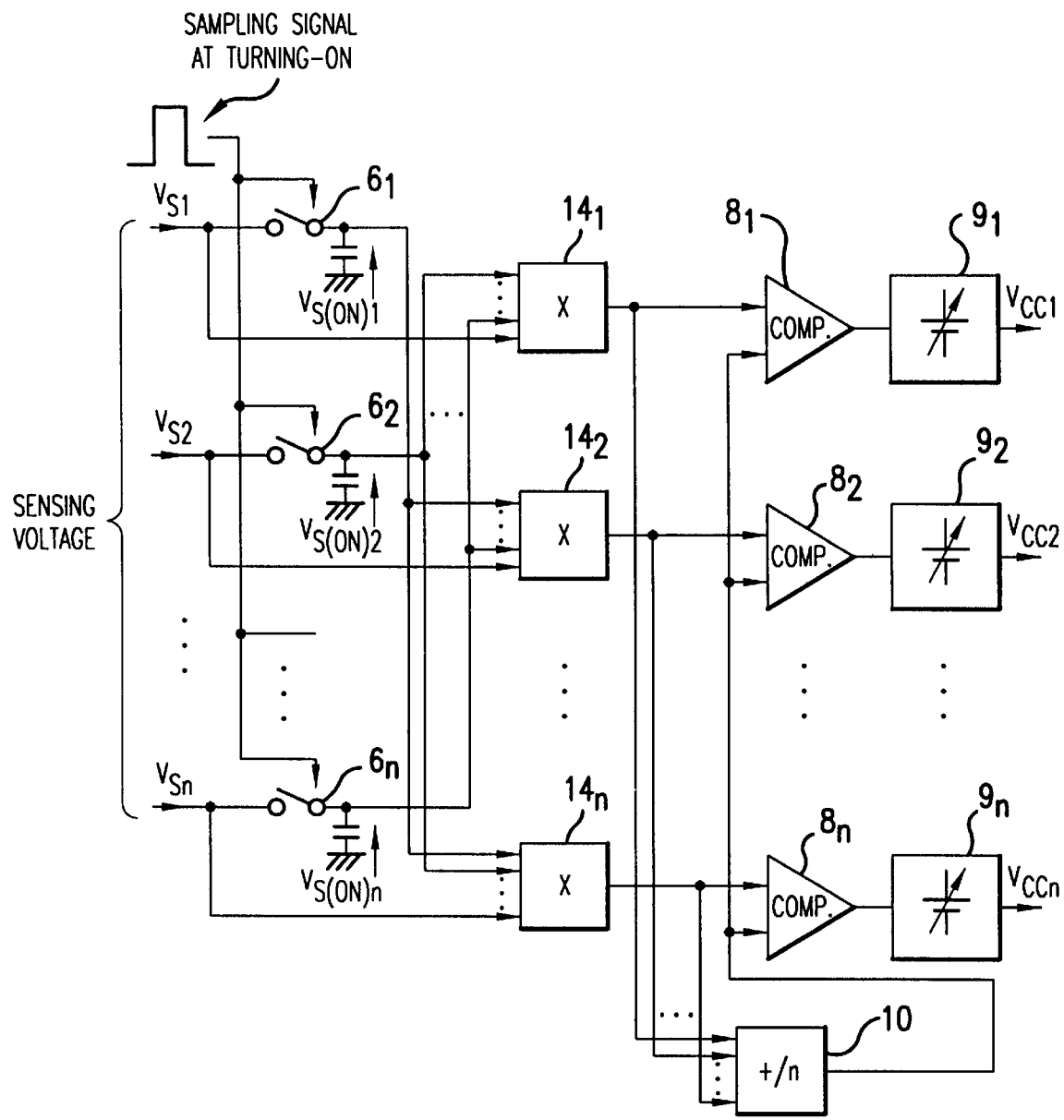
FIG. 3 is a block diagram of a second embodiment of the balancing circuit according to the present invention.

FIG. 3 is a block diagram of a second embodiment of a balancing circuit according to the present invention. The balancing circuit of FIG. 3 is different from the balancing circuit of FIG. 2 in that the outputs fed from the sample hold circuits of all the switching devices, except one specific switching device where the sensing voltage thereof has been sampled, are inputted to one of multiplier circuits $14_1$ through $14_n$ disposed corresponding to the specific switching devices. And, the sensing voltages $V_{s1}$ through $V_{sn}$ in the steady state are inputted to the respective multiplier circuits $14_1$ through $14_n$. For example, the outputs of the sample hold circuits $6_2$ through $6_n$ disposed corresponding to the IGBTs $1_{a2}$ through $1_{an}$ and the sensing voltage $V_{s1}$ of the IGBT $1_{a1}$ are inputted to the multiplier circuit $14_1$ corresponding to the IGBT $1_{a1}$. The outputs of the multiplier circuits $14_1$ through $14_n$ are inputted to an average value calculator circuit 10. The outputs of the multiplier circuits $14_1$ through $14_n$ are compared with the output of the calculator circuit 10 in the comparators $8_1$ through $8_n$.

Now, it is assumed that the sensing voltages $V_{s1}$ through $V_{sn}$ across the sensing resistors $1_{d1}$ through $1_{dn}$ at the turning-on of the IGBTs $1_{a1}$ through $1_{an}$ to be $V_{s(on)1}$ through $V_{s(on)1}$ and the sensing voltages $V_{s1}$ through $V_{sn}$ in the steady state to be $V_{s(t)1}$ through $V_{s(t)n}$. Each sensing voltage $V_{si}$ is expressed by the following formula (4) with each collector current $I_{ci}$ and a proportional constant $k_i$ indicative of the distribution of each sensing resistance.

$$V_{si} = k_i \times I_{ci} \quad (i=1, 2, \ldots, n) \tag{4}$$

The output $V_{s(on)i}$ from the sample hold circuits $6_1$ through $6_n$ is expressed with the turning-on collector current $I_{con}$ by the following formula (5).

$$V_{s(on)i} = k_i \times I_{con} \quad (i=1, 2, \ldots, n) \tag{5}$$

Output $V_{mi}$ from one of the amplifier circuits, to which the sensing voltage $V_{s(t)i}$ in the steady state and all the sensing voltages at the turning-on except the sensing voltage $V_{s(on)i}$ of the ith IGBT are inputted, is expressed by the following formula (6).

$$\begin{aligned} V_{mi} &= V_{s(on)1} X V_{s(on)2} X \ldots X V_{s(t)i} X \ldots V_{s(on)n} \\ &= k_1 \cdot I_{con} X k_2 \cdot I_{con} X \ldots X k_i \cdot I_{c(t)i} X \ldots k_n \cdot I_{con} \\ &= (k_1 \cdot k_2 \cdot \ldots \cdot k_n) I_{con}^{n-1} \cdot I_{c(t)i} \\ &= G \cdot I_{c(t)i} \end{aligned} \tag{6}$$

In the formula (6), $G = (k_1 \cdot k_2 \ldots k_n) I_{con}^{n-1}$.

When all the outputs from the multiplier circuits $14_1$ through $14_n$ are inputted to the average value calculator circuit 10, and the output of the multiplier circuit $14_i$ is compared with the output $V_{ave}$ of the calculator circuit 10, the output $V_{ave}$ is expressed by the following formula (7).

$$\begin{aligned} I_{ave} &= (1/n) \sum_{i=1}^{n} V_{mi} \\ &= (1/n) \sum_{i=1}^{n} (k_1 \cdot k_2 \cdot \ldots \cdot k_n) I_{con}^{n-1} \cdot I_{c(t)i} \\ &= G \cdot I_{cave} \end{aligned} \tag{7}$$

$I_{cave}$ in the formula (7) is expressed by the following formula (8).

$$I_{cave} = (1/n) \sum_{i=1}^{n} I_{c(t)i} \tag{8}$$

Therefore, the output $V_{subi}$ from one of the comparators $8_1$ through $8_n$ is expressed by the following formula (9), and the collector currents of the IGBTs can be compared with one another irrespective of the distribution or unbalance of the sensing voltages.

$$V_{subi} = V_{mi} - V_{ave} \quad (9)$$
$$= G \cdot I_{c(t)i} - G \cdot I_{cave}$$
$$= G(I_{c(t)i} - I_{cave})$$

Figure 4:
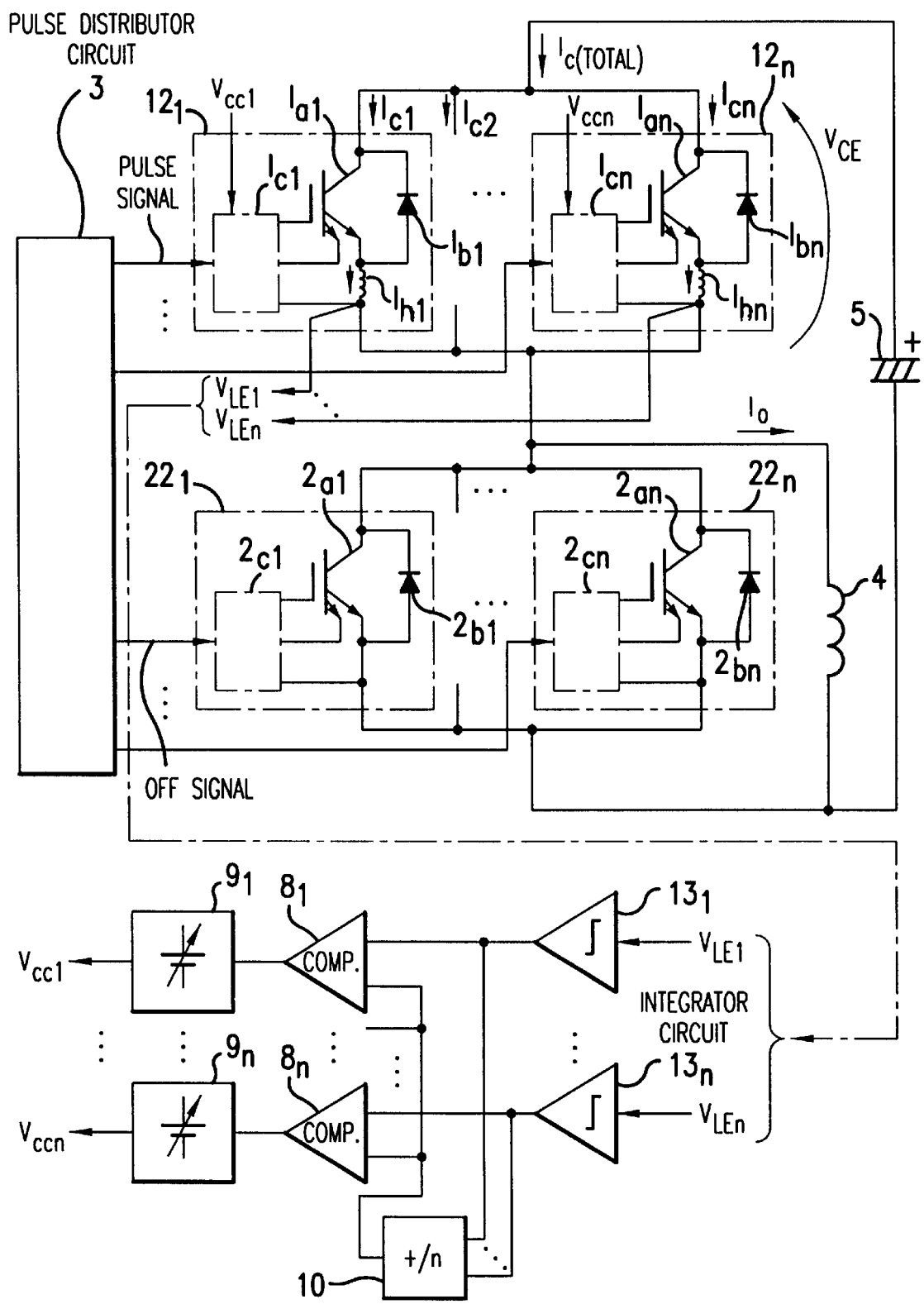
FIG. 4 is a block diagram of a third embodiment of the balancing circuit according to the present invention.

FIG. 4 is a block diagram of a third embodiment of the balancing circuit according to the present invention.

A voltage is induced across the inductance between the auxiliary emitter and main emitter (hereinafter referred to as the "emitter inductance") of the IGBT $1_{ai}$ when the collector current $I_{ci}$ changes. The emitter voltage $V_{LE}$, induced in the switching during which the collector current changes rapidly, is expressed by the following formula (10) with the emitter inductance $L_E$.

$$V_{LE} = L_E (di_c/dt) \quad (10)$$

Therefore, the output expressed by the following formula (11) is obtained by integrating the emitter voltages in the turning-off of the IGBTs $1_{a1}$ through $1_{an}$ in the integrator circuits $13_1$ through $13_n$ shown in FIG. 4 if it is assumed that $1_{h1}$ through $1_{hn}$ are equal to $L_E$. In the formula (11), K represents the gain of the integrator circuits $13_1$ through $13_n$. In FIG. 4, $I_{h1}$ through $I_{hn}$ designate the emitter inductance, and $12_1$ through $12_n$ and $22_1$ through $22_n$ designate switching circuits.

$$v_{inti} = K\int V_{LEi}dt - KL_E\int(di_{ci}/dt)dt \quad (11)$$
$$= KL_E I_{ci} \ (i = 1,2, \ldots ,n)$$

Therefore, the unbalance between the currents of the switching devices is detected by comparing the outputs of the integrator circuits $13_1$ through $13_n$ and the output of an average value calculator circuit 10 in the comparators $8_1$ through $8_n$. And, the currents of the switching devices are balanced with one another with the gate voltage regulator circuits $9_1$ through $9_n$ as described earlier.

The balancing circuit of the invention is applicable to balancing the currents of a plurality of semiconductor switches connected parallel in the electric power converters other than the chopper circuit. The semiconductor switches, the currents of which are balanced by the balancing circuit of the invention, are not limited to the IGBT.

In the first and second aspects of the invention, the balancing circuit takes as a sample and holds the transient sensing voltages at the time of turning-on of the switching devices; detects the unbalance between the currents of the switching devices based on the distribution or unbalance of the sensing voltages by comparing the steady-state sensing voltages or the values corresponding to the steady-state sensing voltages with the stored transient sensing voltages; and balances the steady-state currents of the switching devices by regulating the drive voltages of the switching devices based on the detected distribution of the steady-state currents.

The balancing circuit of the invention facilitates reducing the size of the power converter, since the balancing circuit of the invention employs the sensing resistors with smaller capacity. The balancing circuit of the invention facilitates further reducing the size of the power converters, since the balancing circuit of the invention can be incorporated into the conventional gate drive circuit, wherein such circuits employ the electronic parts and components.

The balancing circuit of the invention greatly improves the current detection accuracy and balance control precision, since the balancing circuit of the invention balances the currents by correcting the distribution or unbalance of the sensing voltages.

By balancing the steady-state currents of the switching devices by regulating the gate voltages, it is unnecessary for the switching devices to exhibit the same saturation voltage between the collector and emitter thereof. Therefore, troublesome jobs in supply and management of the switching devices are avoided.

Although a certain leeway has been allowed in the design of the conventional balancing circuit, it is unnecessary to provide the balancing circuit of the invention with such a leeway and, therefore, further reduction of the size of the present balancing circuit is facilitated, since the balancing circuit of the invention balances the currents very precisely.

In the third aspect of the invention, the configuration of the switching circuits may be simplified by utilizing the wiring inductance between the switching device and its emitter terminal in detecting the sensing voltage without employing any sensing resistance.

What is claimed is:

1. A balancing circuit for balancing steady-state currents of switching devices in an electric power converter, comprising:

a plurality of switching circuits connected parallel to one another, each of said switching circuits including one switching device and a sensing resistor;

a plurality of sample hold means, each sample hold means being connected to one of the switching circuits and holding a transient sensing voltage detected by the sensing resistor at a time of turning-on of the switching device;

a plurality of voltage calculating means, each voltage calculating means being connected to one of the sample hold means and providing an output based on a sensing voltage in a steady state and the transient sensing voltage held in said sample hold means;

average value calculating means connected to the voltage calculating means, said average value calculating means calculating an average of the outputs of said voltage calculating means;

a plurality of comparing means, each comparing means being connected to one of the voltage calculating means and the average value calculating means for comparing an output of said average value calculating means and each output of said voltage calculating means; and a plurality of regulating means, each regulating means being situated between one of the comparing means and one of the switching devices for regulating a drive voltage of said one of the switching devices to equalize inputs to said comparing means with one another.

2. A balancing circuit according to claim 1, wherein said voltage calculating means is amplifying means, each amplifying means amplifying the sensing voltage in the steady state with gains depending on the transient sensing voltages held in the sample hold means.

3. A balancing circuit according to claim 1, wherein said voltage calculating means is multiplying means, each multiplying means multiplying the sensing voltage at the steady state in one of the switching devices and the transient sensing voltages of the other switching devices.

4. A balancing circuit according to claim 1, wherein said sensing resistor is disposed between a sensing terminal and an emitter of the switching device.

5. A balancing circuit for balancing steady-state currents of switching devices in an electric power converter, comprising:

a plurality of switching circuits connected parallel to one another, each of said switching circuits including a switching device;

a plurality of integrating means, each integrating means being connected to the switching device for integrating an induced voltage across an inductance of the switching device with a current changing rate of said each of said switching device;

an average value calculating means connected to the integrating means, said calculating means calculating an average of outputs of said integrating means;

a plurality of comparing means, each comparing means being connected to one of the integrating means and the average value calculating means for comparing an output of said average value calculating means and each output of said integrating means; and a plurality of regulating means, each regulating means being situated between one of the comparing means and one of the switching devices for regulating a drive voltage of said one of the switching devices to equalize inputs to said comparing means with one another.

6. A balance circuit according to claim 5, wherein said switching device includes a main emitter and an auxiliary emitter, said inductance of the switching device being obtained between the main emitter and the auxiliary emitter.

* * * * *

UNITED STATES PATENT AND TRADEMARK OFFICE
CERTIFICATE OF CORRECTION

PATENT NO. : 5,889,663                    Page 1 of 2
DATED      : March 30, 1999
INVENTOR(S): Masafumi Tabata, et al It is certified that error appears in the above-indentified patent and that said Letters Patent is hereby corrected as shown below:

In column 1, line 37, change "$V_{rs1}$ through $V_{rsn}$" to --$V_{Is1}$ through $V_{Isn}$--;

In column 2, line 36, change "switching device" to --shunt resistor--;

In column 3, line 17, change "are" to --is--;

In column 5, line 21, change "do not exhibit tradeoff characteristics in" to --have small--;
              line 22, change "the turning-on," to --turning-on currents,--;
              line 55, change "gate" to --collector--;

In column 6, line 15, change "to be" to --are--;
              line 17, change "to be" to --are--;
              line 20, add after "resistance" --and each sensing current--;
              line 31, change "amplifier" to --multiplier--;
              line 36, change "$...XV_{s(t)i}X...$" to --$...XV_{s(on)(i-1)}XV_{s(t)(i)}XV_{s(on)(i+1)}X...$--;
              line 44, change "14," to --$14_1$--;
              line 51, change "$I_{ave}$" to --$V_{ave}$--;

UNITED STATES PATENT AND TRADEMARK OFFICE
CERTIFICATE OF CORRECTION

PATENT NO. : 5,889,663
DATED : March 30, 1999
INVENTOR(S) : Masafumi Tabata, et al It is certified that error appears in the above-indentified patent and that said Letters Patent is hereby corrected as shown below:

In column 7, line 15, change "$V_{LE} = L_E(di_c/dt)$" to --$V_{LE} = L_E(dI_c/dt)$--;

line 22, change "inductance" to --inductances--; and line 26, change "$V_{inti} = K\int V_{LEi}dt = KL_E\int (di_{ci}/dt)dt$" to --$V_{INTi} = K\int V_{LEi}dt = KL_E\int (dI_{ci}/dt)dt$--.

Signed and Sealed this

Twelfth Day of October, 1999

Attest:

Q. TODD DICKINSON

*Attesting Officer*  *Acting Commissioner of Patents and Trademarks*